United States Patent
Sakai

(10) Patent No.: US 7,939,829 B2
(45) Date of Patent: May 10, 2011

(54) SEMICONDUCTOR DEVICE AND DISPLAY DEVICE

(75) Inventor: Takeshi Sakai, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 345 days.

(21) Appl. No.: 12/222,152

(22) Filed: Aug. 4, 2008

(65) Prior Publication Data

US 2009/0045404 A1    Feb. 19, 2009

(30) Foreign Application Priority Data

Aug. 14, 2007  (JP) ................. 2007-211355

(51) Int. Cl.
 *H01L 27/14* (2006.01)
(52) U.S. Cl. ..... 257/72; 257/59; 257/347; 257/E29.151; 349/43
(58) Field of Classification Search .......... 257/59, 257/72, 347, E29.151; 349/43
See application file for complete search history.

(56) References Cited

U.S. PATENT DOCUMENTS

| | | | |
|---|---|---|---|
| 6,614,500 B2 * | 9/2003 | Kim | 349/152 |
| 6,642,979 B2 * | 11/2003 | Choo et al. | 349/113 |
| 6,683,668 B2 * | 1/2004 | Moon et al. | 349/138 |

* cited by examiner

*Primary Examiner* — Fernando L Toledo
*Assistant Examiner* — Yu-Hsi Sun
(74) *Attorney, Agent, or Firm* — Stites & Harbison, PLLC; Juan Carlos A. Marquez, Esq.

(57) ABSTRACT

A semiconductor device can easily reduce a leak current which flows when a reversely-staggered-type TFT element in which an active layer is made of polycrystalline semiconductor is turned off. The semiconductor device includes a reversely-staggered-type TFT element in which a semiconductor layer, a source electrode and a drain electrode are arranged on a surface of an insulation film, and a portion of the source electrode and a portion of the drain electrode respectively get over the semiconductor layer. The active layer of the semiconductor layer is mainly made of polycrystalline semiconductor constituted of strip-shaped crystals elongated in the channel length direction of the TFT element, and is configured in a plan view such that the source electrode and the drain electrode are respectively pulled out from positions above the active layer in the channel width direction of the TFT element and in the directions opposite to each other, and the source electrode intersects with only one side out of two sides of the active layer which extend in the channel length direction, and the drain electrode intersects with only another side out of two sides of the active layer which extend in the channel length direction.

14 Claims, 11 Drawing Sheets

SEMICONDUCTOR DEVICE AND DISPLAY DEVICE

CLAIM OF PRIORITY

The present application claims priority from Japanese application serial No. 2007-211355, filed on Aug. 14, 2007, the content of which is hereby incorporated by reference into this application.

BACKGROUND OF THE INVENTION

1. Field of the Invention

The present invention relates to a semiconductor device and a display device, and more particularly to a technique which is effectively applicable to a display device having a display panel which incorporates a drive circuit therein outside a display region.

2. Background Art

Conventionally, as a TFT element used in a semiconductor device or the like, there has been known a reversely-staggered-type (also referred to as a bottom-gate type) TFT element. The reversely-staggered-type TFT element is a TFT element which is formed by stacking a gate electrode, an insulation film, a semiconductor layer, a source electrode and a drain electrode on a surface of a substrate such as an insulation substrate in this order.

Further, with respect to the reversely-staggered-type TFT element, there has been known a TFT element which arranges the semiconductor layer, the source electrode and the drain electrode on a surface of the insulation film. In such arrangement, a portion of the source electrode and a portion of the drain electrode respectively get over the semiconductor layer. Further, the semiconductor layer includes an active layer, a first contact layer interposed between the active layer and the source electrode, and a second contact layer interposed between the active layer and the drain electrode. Further, the first contact layer and the second contact layer are arranged only on the active layer as viewed from the insulation substrate in general.

The reversely-staggered-type TFT element is used as an active element in an active-matrix-type liquid crystal display panel, for example. The active-matrix-type liquid crystal display panel is a display panel which seals a liquid crystal material between two substrates, wherein on a surface of one substrate out of these two substrates, for example, on a surface of an insulation substrate which possesses high optical transmissivity such as a glass substrate, a plurality of scanning signal lines, a plurality of video signal lines, a plurality of active elements and a plurality of pixel electrodes are arranged. Here, when the active element is a TFT element, such one substrate is referred to as a TFT substrate.

In a liquid crystal display device using the above-mentioned liquid crystal display panel, a control of timing of generation or inputting of scanning signals inputted to the scanning signal lines, and a control of timing of generation or inputting of video signals inputted to the video signal lines are conventionally performed using an IC chip (driver IC) manufactured in a step different from a step for manufacturing the TFT substrate.

However, recently, there has been proposed a liquid crystal display panel which forms an integrated circuit (drive circuit) equivalent to the above-mentioned IC chip outside a display region of the TFT substrate, that is, outside a display region in which active elements and pixel electrodes are arranged in a matrix array in a manufacturing step of the TFT substrate, for example. Hereinafter, the integrated circuit formed outside the display region is referred to as a peripheral circuit.

The peripheral circuit on the TFT substrate is constituted of an n-channel MOSFET (hereinafter referred to as nMOS) and a p-channel MOSFET (hereinafter referred to as pMOS), a CMOS which is formed by combining the nMOS and the pMOS, a resistance element, a capacitive element and the like formed on a surface of a glass substrate, for example. Here, to efficiently manufacture the nMOS and the pMOS, it is desirable that the nMOS and the pMOS have the same constitution as the TFT element arranged in the display region, for example. That is, when the TFT element in the display region is of the reversely-staggered-type, it is desirable that the nMOS and the pMOS which constitute the peripheral circuit also are of the reversely-staggered-type in the same manner as the TFT element.

When the TFT element in the display region of the TFT substrate is of the reversely-staggered-type, the active layer is often formed using amorphous semiconductor such as amorphous silicon (a-Si), for example. Accordingly, in forming the TFT elements in the display region and the TFT element in the peripheral circuit using the reversely-staggered-type structure, to manufacture these TFT elements most efficiently, the active layer of the TFT element of the peripheral circuit may be also formed using amorphous silicon.

However, it is necessary to operate the TFT element in the peripheral circuit at extremely high speed compared to an operation of the TFT element in the display region. Accordingly, it is desirable to form the active layer of the TFT element in the peripheral circuit using poly-crystalline semiconductor such as poly crystalline silicon (poly-Si), for example.

From the above, in manufacturing the TFT substrate in which both of the TFT elements in the display region and the TFT element in the peripheral circuit are of the reversely-staggered-type, in general, for example, an amorphous silicon film used for forming active layers of the respective TFT elements are formed and, thereafter, only a region of the amorphous silicon film where the active layer of the TFT element in the peripheral circuit is formed is formed into polycrystalline silicon.

In forming only the region of the amorphous silicon film where the active layer of the TFT element in the peripheral circuit is formed into polycrystalline silicon, for example, amorphous silicon in the region is dehydrogenated and, thereafter, amorphous silicon is melted by radiation of laser beams, and molten silicon is crystallized or re-crystallized. Further, in forming amorphous silicon into polycrystalline silicon, energy of radiating laser beams and a moving speed of a radiation position are adjusted thus forming polycrystalline silicon which is constituted of a mass of fine crystals or granular crystals mainly formed of strip-shaped crystals elongated in the channel length direction of the formed TFT element, for example. With the formation of such polycrystalline silicon, the mobility of carriers can be enhanced thus realizing the high speed operation of the TFT element.

SUMMARY OF THE INVENTION

However, when the TFT element in the peripheral circuit of the TFT substrate is of the reversely-staggered-type which has the above-mentioned constitution and the active layer is formed using polycrystalline semiconductor such as polycrystalline silicon, there has been a drawback that a leak current flows between a source electrode and a drain electrode even when the TFT element is in an OFF state, for example.

FIG. 6A to FIG. 6C are schematic views for explaining one constitutional example of a conventional reversely-staggered-type TFT element and one example of a cause which produces the flow of a leak current.

FIG. 6A is a schematic plan view showing one constitutional example of the conventional reversely-staggered-type TFT element. FIG. 6B is a schematic cross-sectional view showing one example of the cross-sectional constitution taken along a line D-D' in FIG. 6A. FIG. 6C is a schematic plan view showing the schematic constitution of an active layer of the TFT element shown in FIG. 6A and a path of the leak current.

The reversely-staggered-type TFT element used in a conventional semiconductor device adopts the constitution shown in FIG. 6A and FIG. 6B, for example. On a surface of an insulation substrate 1, a gate electrode 2, an insulation layer 3, a semiconductor layer 4, a source electrode 501 and a drain electrode 502 are stacked in this order. Here, the semiconductor layer 4 is constituted of an active layer 401 which stereoscopically intersects with the gate electrode 2, a first contact layer 402 interposed between the active layer 401 and the source electrode 501, and a second contact layer interposed between the active layer 401 and the drain electrode 502.

Further, the semiconductor layer 4, the source electrode and the drain electrode 502 are arranged on a surface of the insulation layer 3 having a function of the gate insulation film of the TFT element. Here, the source electrode 501 gets over the active layer 401 from one side E3 out of two sides (etching end surfaces in actual structure) E3, E4 of the active layer 401 which extend in the channel width direction (y direction), and the drain electrode 502 gets over the active layer 401 from another side E4 out of the above-mentioned two sides E3, E4 of the active layer 401 which extend in the channel width direction. That is, the source electrode 501 and the drain electrode 502 are pulled out from positions above the active layer 401 in the channel length direction (x direction) and, at the same time, in the directions opposite to each other.

In forming such a reversely-staggered-type TFT element, in a generally known manufacturing method, as shown in FIG. 6B, the first contact layer 402 and the second contact layer 403 are formed only on the active layer 401 as viewed from the insulation substrate 1. Accordingly, the source electrode 501 is brought into direct contact with the above-mentioned one etching end surface E3 of the active layer 401, and the drain electrode 502 is brought into direct contact with another etching end surface E4 of the active layer 401.

Further, in forming the active layer 401 of such a reversely-staggered-type TFT element using polycrystalline silicon, the active layer 401 is, for example, as shown in FIG. 6C, formed of a mass of fine crystals or granular crystals mainly formed of the strip-shaped crystals elongated in the substantially channel length direction. In FIG. 6C, fine lines shown in the inside of the active layer 401 are boundaries of fine crystals or granular crystals (grain boundaries).

In the reversely-staggered-type TFT element having such constitution, a metal silicide layer is formed in a portion C3 where the source electrode 501 and the active layer 401 are brought into direct contact with each other and in a portion C4 where the drain electrode 502 and the active layer 401 are brought into direct contact with each other thus forming low-resistance contact regions. Further, a path through which an electric current flows between the low-resistance contact region C3 where the source electrode 501 and the active layer 401 are brought into direct contact with each other, and the low-resistance contact region C4 where the drain electrode 502 and the active layer 401 are brought into direct contact with each other is a path indicated by a bold-line arrow shown in FIG. 6C, and this path substantially agrees with the channel length direction. Further, the active layer 401 is formed using polycrystalline silicon mainly formed of strip-shaped crystals elongated in the channel length direction and hence, mobility of carriers in the channel length direction is high whereby an electric current is liable to easily flow. Accordingly, there has been a drawback that in a state that a potential of the gate electrode 2 assumes a potential which turns off the TFT element, for example, when holes are induced in the active layer 401, a resistive leak current flows between the source electrode 501 and the drain electrode 502 via the low-resistance contact regions C3, C4.

FIG. 7A and FIG. 7B are schematic views for explaining another constitutional example of the conventional reversely-staggered-type TFT element and one example of a cause which produces the flow of a leak current.

FIG. 7A is a schematic plan view showing another constitutional example of the conventional reversely-staggered-type TFT element. FIG. 7B is a schematic plan view showing the schematic constitution of an active layer of the TFT element shown in FIG. 7A and a path of the leak current.

With respect to the conventional reversely-staggered-type TFT element, there has been also known a TFT element configured in a plan view such that, for example, as shown in FIG. 7A, a source electrode 501 and a drain electrode 502 are respectively arranged to intersect with two sides (etching end surfaces in actual structure) E1, E2 of an active layer 401 which extend in the channel length direction (x direction).

In such a reversely-staggered-type TFT element, on one side (etching end surface) E1 out of the two sides E1, E2 of the active layer 401 which extend in the channel length direction, a low-resistance contact region C1 where the source electrode 501 and the active layer 401 are brought into direct contact with each other and a low-resistance contact region C1' where the drain electrode 502 and the active layer 401 are brought into direct contact with each other are formed. In the same manner, on another side (etching end surface) E2 out of the two sides E1, E2 of the active layer 401 which extend in the channel length direction, a low-resistance contact region C2' where the source electrode 501 and the active layer 401 are brought into direct contact with each other and a low-resistance contact region C2 where the drain electrode 502 and the active layer 401 are brought into direct contact with each other are formed.

In such constitution, when the active layer 401 is formed using polycrystalline silicon as shown in FIG. 7B, for example, a path through which an electric current flows between the low-resistance contact region C1 where the source electrode 501 and the active layer 401 are brought into direct contact with each other and the low-resistance contact region C1' where the drain electrode 502 and the active layer 401 are brought into direct contact with each other on one etching end surface E1 of the active layer 401, and a path through which an electric current flows between the low-resistance contact region C2' where the source electrode 501 and the active layer 401 are brought into direct contact with each other and the low-resistance contact region C2 where the drain electrode 502 and the active layer 401 are brought into direct contact with each other on another etching end surface E2 of the active layer 401 respectively constitutes paths indicated by a bold-line arrow shown in FIG. 7B. Accordingly, there has been a drawback that in a state that a potential of the gate electrode 2 assumes a potential which turns off the TFT element, for example, when holes are induced in the active layer 401, a resistive leak current flows between the source electrode 501 and the drain electrode 502 via the low-resistance contact regions C1, C1' on the etching end surface E1 or the low-resistance contact regions C2', C2 on the etching end surface E2.

That is, in the conventional reversely-staggered-type TFT element, the active layer 401, the source electrode 501 and the drain electrode 502 are arranged on a surface of the insulation layer 3 which functions as a gate insulation film of the TFT element. In a state that respective portions of the source electrode 501 and the drain electrode 502 get over the active layer 401, when the active layer 401 is formed using polycrystalline silicon, there has been a drawback that a leak current flows between the source electrode 501 and the drain electrode 502 even when the TFT element is in an OFF state.

Accordingly, it is an object of the present invention to provide a technique which, in a semiconductor device having a reversely-staggered-type TFT element in which an active layer is formed using polycrystalline semiconductor, for example, can easily reduce a leak current which flows in the TFT element when a TFT element is turned off.

The above-mentioned and other objects and novel features of the present invention will become apparent from the description of this specification and attached drawings.

To explain the summary of typical inventions among the inventions disclosed in this specification, they are as follows.

(1) In a semiconductor device having a TFT element in which a gate electrode, an insulation film, a semiconductor layer, a source electrode and a drain electrode are stacked on a surface of an insulation substrate in this order, and the semiconductor layer, the source electrode and the drain electrode are arranged on a surface of the insulation film, and a portion of the source electrode and a portion of the drain electrode respectively get over the semiconductor layer, the semiconductor layer includes an active layer made of polycrystalline semiconductor, a first contact layer interposed between the active layer and the source electrode, and a second contact layer interposed between the active layer and the drain electrode, the active layer is a mass of fine crystals or granular crystals mainly constituted of strip-shaped crystals elongated in the channel length direction of the TFT element, and the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

(2) In a semiconductor device having a TFT element in which a gate electrode, an insulation film, a semiconductor layer, a source electrode and a drain electrode are stacked on a surface of an insulation substrate in this order, and the semiconductor layer, the source electrode and the drain electrode are arranged on a surface of the insulation film, and a portion of the source electrode and a portion of the drain electrode respectively get over the semiconductor layer, the semiconductor layer includes an active layer, a first contact layer interposed between the active layer and the source electrode, and a second contact layer interposed between the active layer and the drain electrode, the active layer includes a polycrystalline semiconductor layer which is formed of a mass of fine crystals or granular crystals mainly constituted of strip-shaped crystals elongated in the channel length direction of the TFT element and an amorphous semiconductor layer which is stacked on the polycrystalline semiconductor layer as viewed from the insulation substrate, the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

(3) In the semiconductor device having the constitution (1) or (2), the first contact layer and the second contact layer are respectively arranged only on an upper portion of the active layer as viewed from the insulation substrate, and the source electrode and an etching end surface of the active layer are brought into direct contact with each other, and the drain electrode and an etching end surface of the active layer are brought into direct contact with each other.

(4) In the semiconductor device having the constitution (1) or (2), connecting portions of the source electrode and the active layer are connected with each other via the first contact layer over the whole region, and connecting portions of the drain electrode and the active layer are connected with each other via the second contact layer over the whole region.

(5) In the semiconductor device having the constitution (4), the first contact layer is also interposed between a portion of the source electrode which is pulled out to the outside of the active layer and the insulation layer, and the second contact layer is also interposed between a portion of the drain electrode which is pulled out to the outside of the active layer and the insulation layer.

(6) In a display device including an insulation substrate, a display region which is formed of a mass of a plurality of pixel regions and one or a plurality of integrated circuit regions arranged outside the display region, a TFT element is arranged in the integrated circuit region, the TFT element is formed by stacking a gate electrode, an insulation film, a semiconductor layer, a source electrode and a drain electrode on a surface of an insulation substrate in this order, the semiconductor layer, the source electrode and the drain electrode are arranged on a surface of the insulation film, and a portion of the source electrode and a portion of the drain electrode respectively get over the semiconductor layer, the semiconductor layer includes an active layer made of polycrystalline semiconductor, a first contact layer interposed between the active layer and the source electrode, and a second contact layer interposed between the active layer and the drain electrode, the active layer is a mass of fine crystals or granular crystals mainly constituted of strip-shaped crystals elongated in the channel length direction of the TFT element, the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

(7) In a display device including an insulation substrate, a display region which is formed of a mass of a plurality of pixel regions and one or a plurality of integrated circuit regions arranged outside the display region, a TFT element is arranged in the integrated circuit region, the TFT element is formed by stacking a gate electrode, an insulation film, a semiconductor layer, a source electrode and a drain electrode on a surface of an insulation substrate in this order, and the semiconductor layer, the source electrode and the drain electrode are arranged on a surface of the insulation film, and a portion of the source electrode and a portion of the drain electrode respectively get over the semiconductor layer, the semiconductor layer includes an active layer, a first contact layer interposed between the active layer and the source electrode, and a second contact layer interposed between the active layer and the drain electrode, the active layer includes a polycrystalline semiconductor layer which is formed of a mass of fine crystals or granular crystals mainly constituted of strip-shaped crystals elongated in the channel length direction of the TFT element and an amorphous semiconductor layer which is stacked on the polycrystalline semiconductor layer as viewed from the insulation substrate, the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

(8) In the display device having the constitution (6) or (7), in each one of the plurality of pixel regions formed in the display region, a switching element and a pixel electrode are arranged.

(9) In the display device having the constitution (8), the switching element is a MISFET having an amorphous semiconductor layer.

(10) In the display device having the constitution (8), the switching element is a MISFET having a polycrystalline semiconductor layer.

(11) In the display device having the constitution (6) or (7), the plurality of TFT elements and the plurality of pixel electrodes are arranged in the display region in a matrix array.

(12) In the display device having any one of the constitutions (6) to (11), the first contact layer and the second contact layer are respectively arranged only on an upper portion of the active layer as viewed from the insulation substrate, and the source electrode and an etching end surface of the active layer are brought into direct contact with each other, and the drain electrode and an etching end surface of the active layer are brought into direct contact with each other.

(13) In the display device having any one of the constitutions (6) to (11), connecting portions of the source electrode and the active layer are connected with each other via the first contact layer over the whole region, and connecting portions of the drain electrode and the active layer are connected with each other via the second contact layer over the whole region.

(14) In the display device having the constitution (13), the first contact layer is also interposed between a portion of the source electrode which is pulled out to the outside of the active layer and the insulation layer, and the second contact layer is also interposed between a portion of the drain electrode which is pulled out to the outside of the active layer and the insulation layer.

According to the semiconductor device and the display device of the present invention, it is possible to easily reduce a leak current which flows when the reversely-staggered-type TFT element arranged on the surface of the insulation substrate is turned off.

DESCRIPTION OF THE PREFERRED EMBODIMENT

Hereinafter, the present invention is explained in detail in conjunction with an embodiment by reference to the drawings.

Here, in all drawings for explaining the embodiment, parts having identical functions are given same symbols and their repeated explanation is omitted.

Embodiment

Figure 1A:
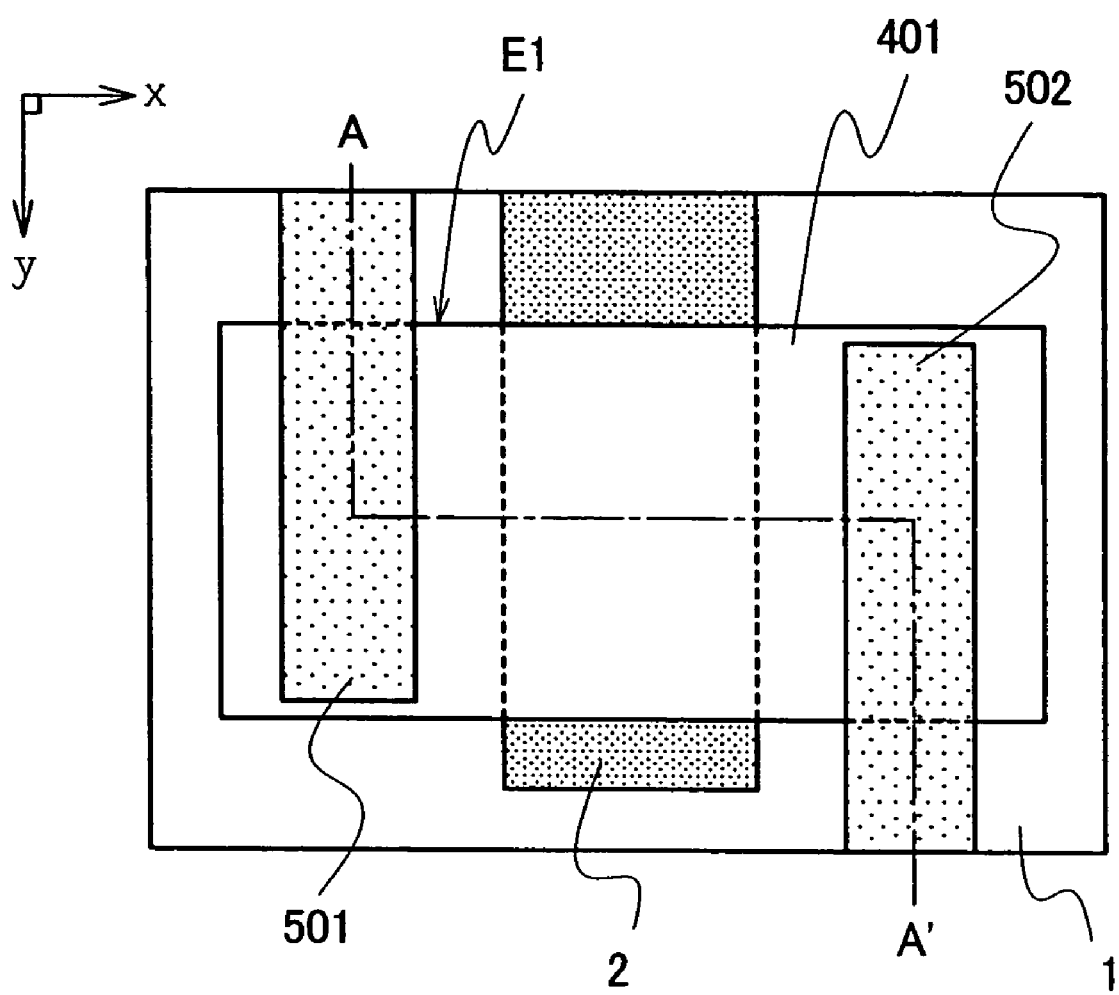
FIG. 1A is a schematic plan view showing the schematic constitution of a TFT element of an embodiment.
Figure 1B:
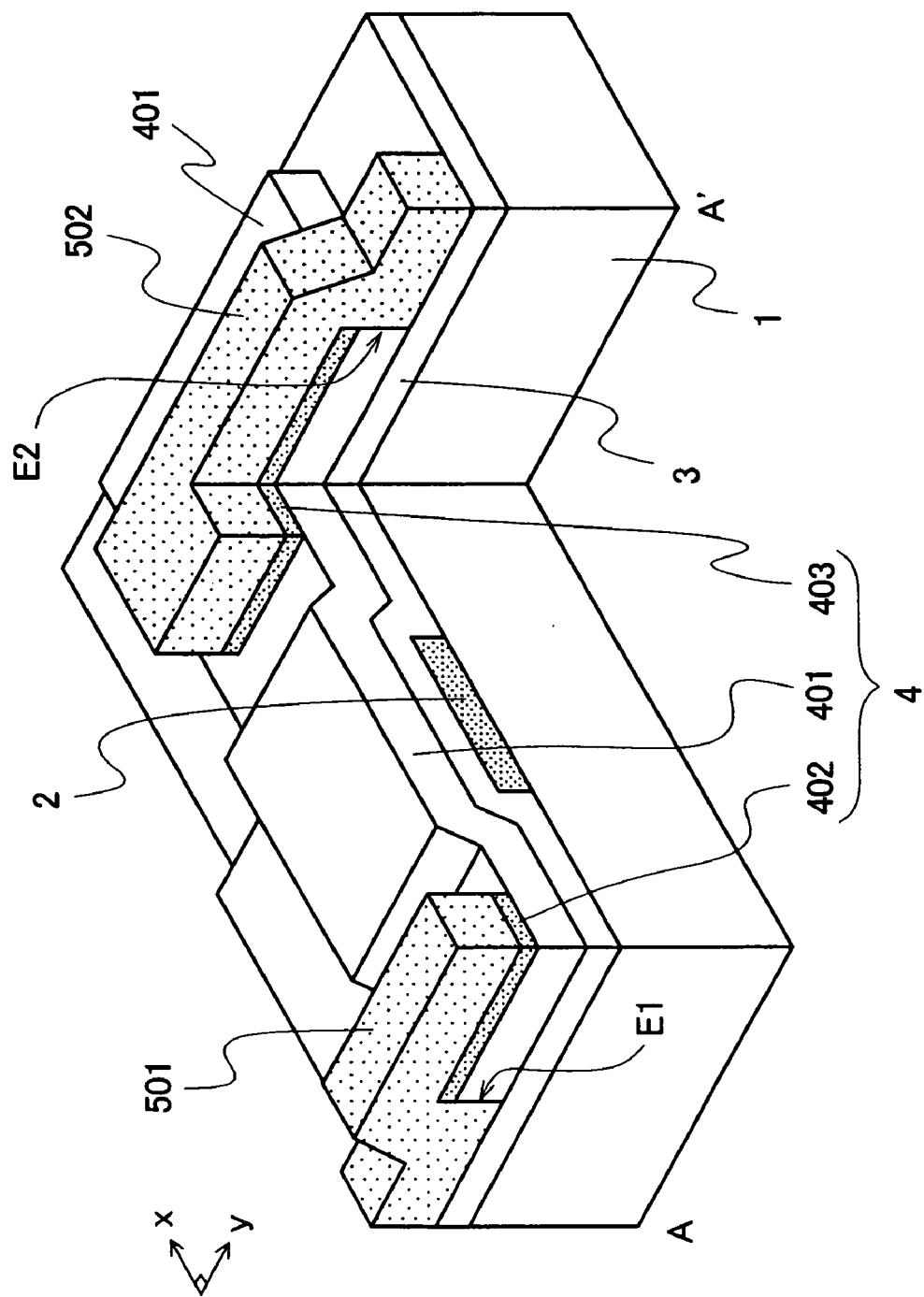
FIG. 1B is a schematic perspective view showing one example of the cross-sectional constitution of the TFT element taken along a line A-A' in FIG. 1A.
Figure 1C:
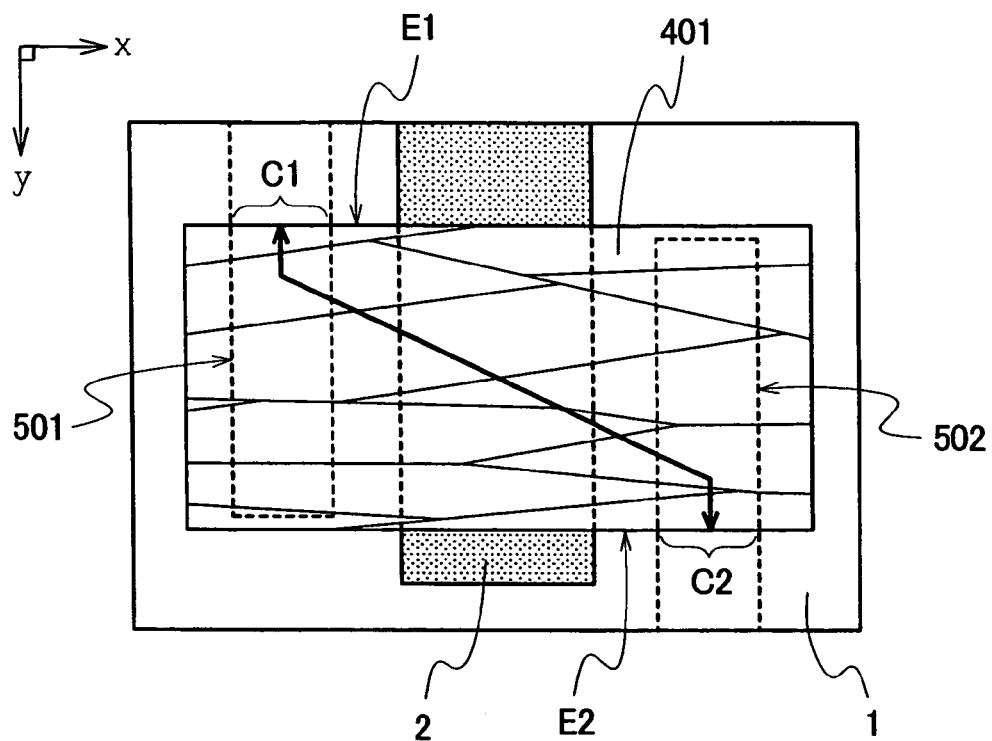
FIG. 1C is a schematic plan view showing the schematic constitution of an active layer in the TFT element of the embodiment and one example of a path of a leak current.

FIG. 1A to FIG. 1C are schematic views showing the schematic constitution of a TFT element of one embodiment according to the present invention.

FIG. 1A is a schematic plan view showing the schematic constitution of the TFT element of this embodiment. FIG. 1B is a schematic perspective view showing one example of the cross-sectional constitution taken along a line A-A' in FIG. 1A. FIG. 1C is a schematic plan view showing the schematic constitution of an active layer in the TFT element of this embodiment and one example of a path of a leak current. In FIG. 1A, an insulation layer is omitted.

The TFT element of this embodiment is of a reversely-staggered-type. As shown in FIG. 1A and FIG. 1B, for example, on a surface of an insulation substrate 1, a gate electrode 2, an insulation layer 3, a semiconductor layer 4, a source electrode 501 and a drain electrode 502 are stacked in this order. Here, the semiconductor layer 4 is constituted of an active layer 401 which stereoscopically intersects with the gate electrode 2, a first contact layer 402 interposed between the active layer 401 and the source electrode 501, and a second contact layer 403 interposed between the active layer 401 and the drain electrode 502. Further, in the TFT element of this embodiment, the active layer 401 is, for example, as shown in FIG. 1C, formed using polycrystalline silicon constituted of a mass of fine crystals or granular crystals mainly formed of strip-shaped crystals elongated in the channel length direction (x direction). Here, as shown in FIG. 1C, fine lines drawn in the inside of the active layer 401 indicate boundaries of fine crystals or granular crystals (grain boundaries). Further, a first contact layer 402 and the second contact layer 403 are formed using n-type amorphous silicon, for example.

Further, the semiconductor layer 4, the source electrode 501 and the drain electrode 502 are arranged on a surface of the insulation layer 3 having a function of the gate insulation film of the TFT element.

Here, the source electrode 501 gets over the active layer 401 from one side E1 out of two sides (etching end surfaces in actual structure) E1, E2 of the active layer 401 which extend in the channel length direction (x direction) and, as viewed in a plan view, intersects with only one side E1 of the active layer 401. Further, the drain electrode 502 gets over the active layer 401 from another side E2 out of the two sides E1, E2 of the active layer 401 which extend in the channel length direction and, as viewed in a plan view, intersects with only another side E2 of the active layer 401. That is, in the TFT element of this embodiment, the source electrode 501 and the drain electrode 502 are pulled out from positions above the active layer 401 in the channel width direction (y direction) and, at the same time, in the directions opposite to each other.

In forming such a reversely-staggered-type TFT element, in a generally known manufacturing method, as shown in FIG. 1B, the first contact layer 402 and the second contact layer 403 are formed only on an upper portion of the active layer as viewed from the insulation substrate 1. The above-mentioned one etching end surface E1 of the active layer 401 and the source electrode 501 are brought into direct contact with each other, and another etching end surface E2 of the active layer 401 and the drain electrode 502 are brought into direct contact with each other.

In the reversely-staggered-type TFT element of this embodiment, a metal silicide layer is formed in a portion C1 where the source electrode 501 and the active layer 401 are brought into direct contact with each other and in a portion C2 where the drain electrode 502 and the active layer 401 are brought into direct contact with each other thus forming low-resistance contact regions. Further, a path through which an electric current flows between the low-resistance contact region C1 where the source electrode 501 and the active layer 401 are brought into direct contact with each other, and the low-resistance contact region C2 where the drain electrode 502 and the active layer 401 are brought into direct contact with each other constitutes a path indicated by a bold-line arrow shown in FIG. 1C, for example. Accordingly, for example, when a potential of the gate electrode 2 assumes a potential which turns off the TFT element and holes are induced in the active layer 401, a resistive leak current which flows between the source electrode 501 and the drain electrode 502 via the low-resistance contact regions C1, C2 is forced to get over (traverse) a large number of grain boundaries. The grain boundaries in polycrystalline silicon functions as the resistance against an electric current which flows in polycrystalline silicon and hence, by increasing the number of grain boundaries which the leak current is required to get over, it is possible to reduce the leak current compared to a leak current which flows in a conventional reversely-staggered-type TFT element having the planar constitution.

Further, in the reversely-staggered-type TFT element of this embodiment, when the potential of the gate electrode 2 assumes a potential which turns on the TFT element, an ON current flows between the source electrode 501 and the drain electrode 502 via the first contact layer 402, the active layer 401 and the second contact layer 403. The ON current which flows in such an operation of the TFT element flows in the direction which substantially agrees with the channel length direction (x direction) and hence, a magnitude of the ON current can be maintained at a level substantially equal to an ON current which flows in the conventional reversely-staggered-type TFT element having the planar constitution.

Next, one example of a method of forming the reversely-staggered-type TFT element shown in FIG. 1A to FIG. 1C is briefly explained.

In forming the reversely-staggered-type TFT element shown in FIG. 1A to FIG. 1C, first of all, a metal film constituted of a molybdenum-tungsten (MoW) film or the like, for example, is formed on the whole surface of the insulation substrate 1, and the metal film is etched to form the gate electrode 2.

Next, the insulation layer 3 constituted of a silicon oxide film, a silicon nitride film or the like is formed on the whole surface of the insulation substrate 1.

Next, an amorphous silicon film, for example, is formed on the whole surface of the insulation layer 3, and the amorphous silicon film is dehydrogenated. Then, for example, laser beams are radiated to the amorphous silicon film to melt the amorphous silicon film, and molten silicon is crystallized thus forming, as shown in FIG. 1C, polycrystalline silicon constituted of a mass of fine crystals or granular crystals mainly formed of strip-shaped crystals elongated in one direction (channel length direction). Here, amorphous silicon can be formed into polycrystalline silicon by adjusting energy of radiated laser beams and a moving speed of the radiation position and hence, the detailed explanation of the formation of the polycrystalline silicon from amorphous silicon is omitted. Further, in forming amorphous silicon into polycrystalline silicon, the whole amorphous silicon film may be formed into polycrystalline silicon, or only a region of the amorphous silicon film where the TFT element is formed and a portion of the amorphous silicon film surrounding the region may be partially formed into polycrystalline silicon.

Next, on the whole surface of the silicon film which has the whole or the portion thereof formed into polycrystalline silicon, for example, an n-type amorphous silicon film which is used for forming the first contact layer 402 and the second contact layer 403 is formed. Then, the n-type amorphous silicon film and the silicon film are etched thus forming an island-shaped polycrystalline silicon layer which constitutes the active layer 401 of each TFT element. Here, on an upper surface of each polycrystalline silicon layer, an n-type amorphous silicon layer having the same planar shape as the polycrystalline silicon layer is stacked.

Next, a metal film such as an aluminum film, for example, is formed on the whole surface of the insulation layer 3, and the metal film is etched thus forming the source electrode 501 and the drain electrode 502. In etching the metal film, in general, an etching resist is formed on the metal film using photolithography. Accordingly, by merely changing a pattern of an exposure mask used in forming the etching resist, for example, it is possible to form the source electrode 501 and the drain electrode 502 having a pattern shown in FIG. 1A.

Finally, for example, the above-mentioned n-type amorphous silicon layer formed on the active layer 401 is etched using the source electrode 501 and the drain electrode 502 as masks thus forming the first contact layer 402 and the second contact layer 403.

In this manner, the TFT element of this embodiment can be formed using the same steps as a conventional method of forming a reversely-staggered-type TFT element which forms the active layer 401 using polycrystalline silicon constituted of a mass of fine crystals or granular crystals mainly formed of strip-shaped crystals elongated in the channel length direction.

As explained above, according to the reversely-staggered-type TFT element of this embodiment, a leak current which flows in the TFT element when the TFT element is in an OFF state can be easily reduced.

Further, in the reversely-staggered-type TFT element of this embodiment, it is needless to say that materials used for forming the gate electrode 2, the insulation layer 3, the semiconductor layer 4, the source electrode 501 and the drain electrode 502 are not limited to the above-mentioned materials, and materials used for forming the general-type TFT elements may be suitably used. Further, it is needless to say that the source electrode 501 and the drain electrode 502 may be formed using not only a single metal film but also a stacked metal film consisting of two or more kinds of metal films having different compositions, for example.

Figure 2A:
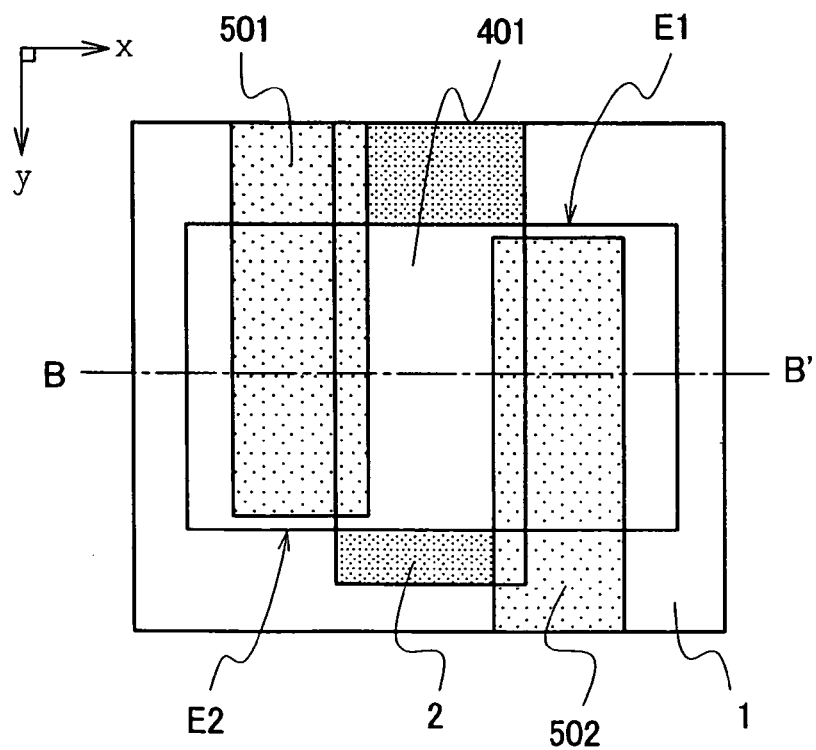
FIG. 2A is a schematic plan view showing the schematic constitution of a TFT element of a modification of the embodiment.
Figure 2B:
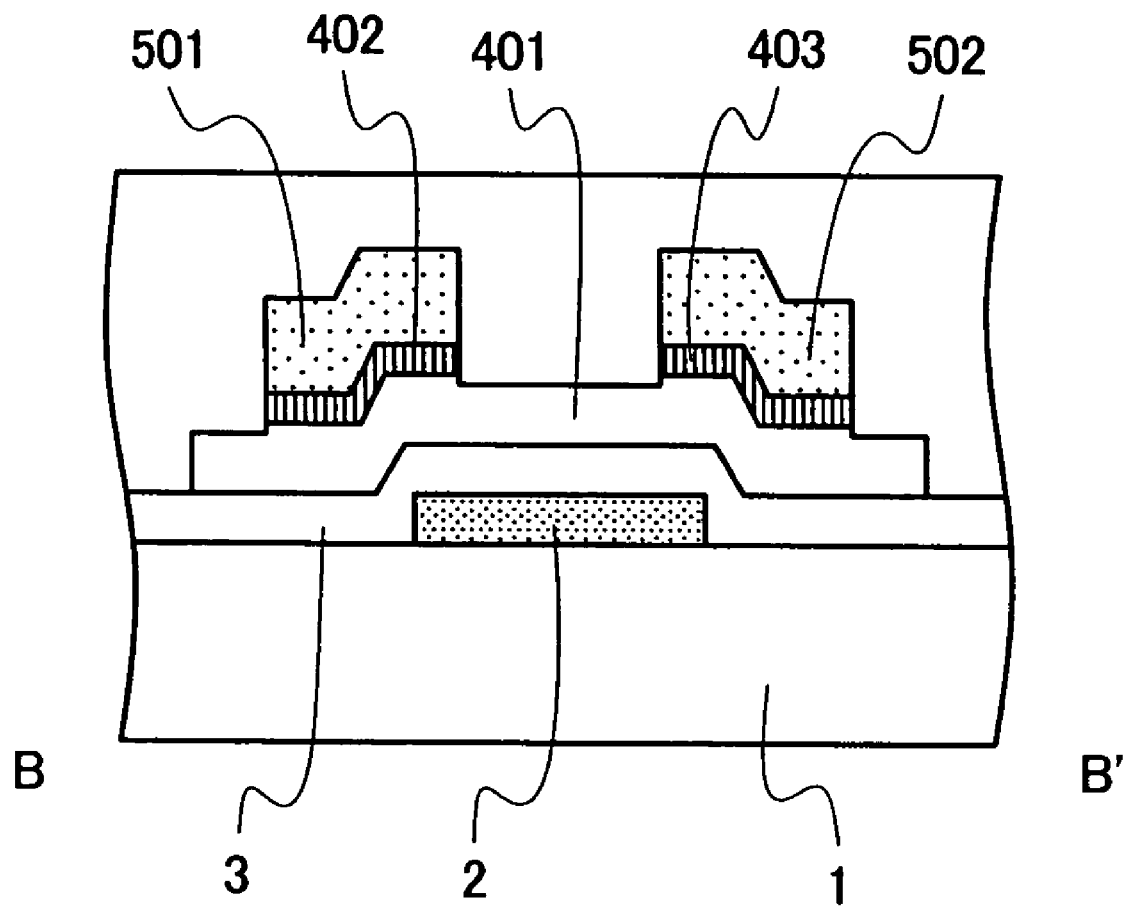
FIG. 2B is a schematic cross-sectional view showing the cross-sectional constitution of the TFT element taken along a line B-B' in FIG. 2A.

FIG. 2A and FIG. 2B are schematic views showing a modification of the TFT element of this embodiment. FIG. 2A is a schematic plan view showing the schematic constitution of the TFT element of the modification of this embodiment. FIG. 2B is a schematic cross-sectional view showing the cross-sectional constitution taken along a line B-B' in FIG. 2A. In FIG. 2A, an insulation layer is omitted.

In explaining the constitution of the TFT element of this embodiment, FIG. 1A and FIG. 1B shows the example in which, when the TFT element is viewed in a plan view, the gate electrode 2, the source electrode 501 and the drain electrode 502 are arranged such that the gate electrode 2 and the source electrode 501 do not overlap with each other and the gate electrode 2 and the drain electrode 502 do not overlap with each other.

However, it is needless to say that the TFT element of this embodiment may be configured such that, for example, as shown in FIG. 2A and FIG. 2B, when the TFT element is viewed in a plan view, the gate electrode 2, the source electrode 501 and the drain electrode 502 are arranged such that a partial region of the gate electrode 2 and a partial region of the source electrode 501 overlap with each other, and a partial region of the gate electrode 2 which differs from the above-mentioned partial region of the gate electrode 2 overlaps with a partial region of the drain electrode 502.

Figure 3:
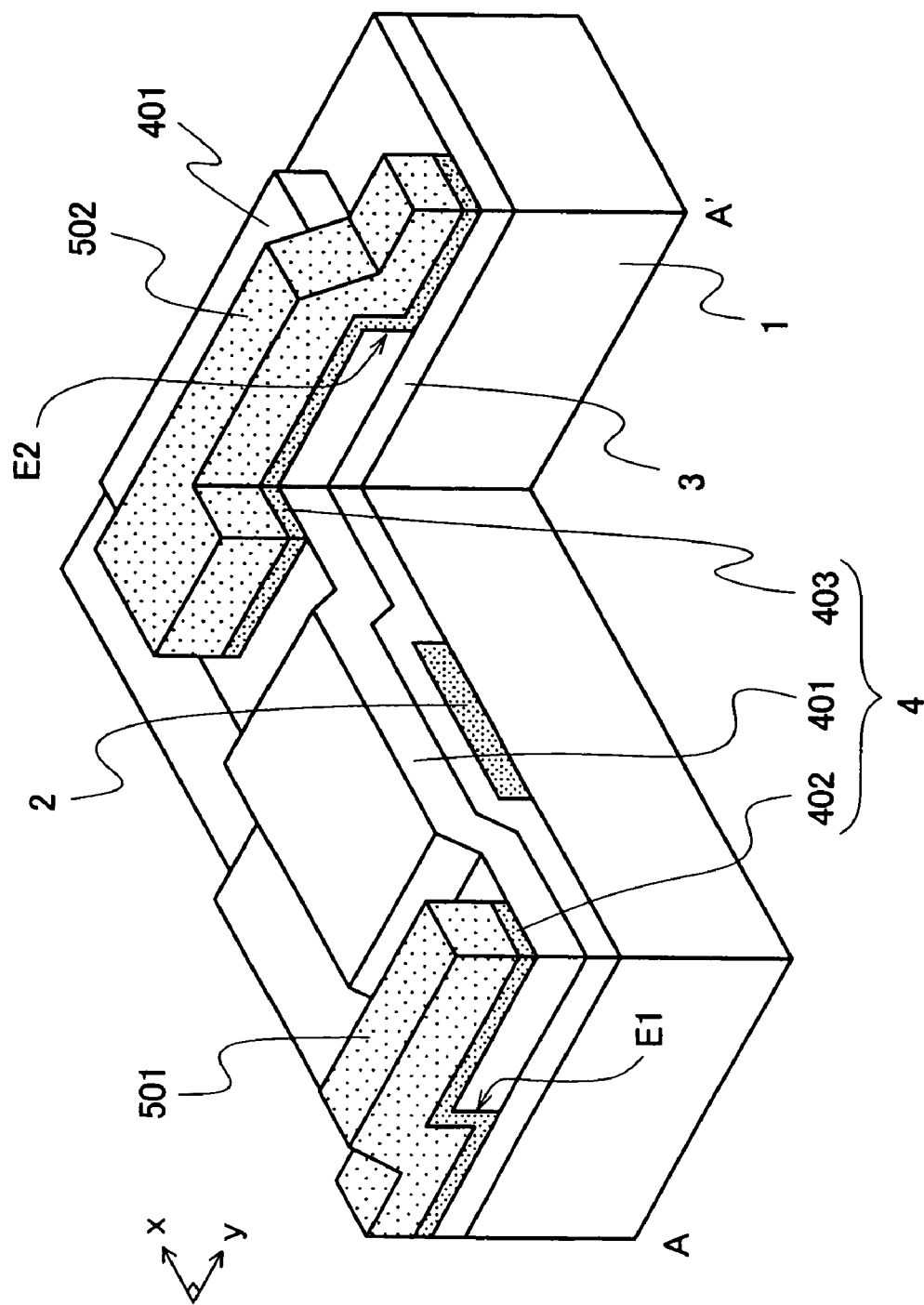
FIG. 3 is a schematic perspective view showing a first application example of the TFT element of the embodiment.

FIG. 3 is a schematic perspective view showing a first application example of the TFT element of this embodiment. Here, FIG. 3 shows the first application example of the cross-sectional constitution taken along a line A-A' in FIG. 1A.

In the reversely-staggered-type TFT element of this embodiment, in general, as shown in FIG. 1B, a first contact layer 402 and a second contact layer 403 are formed only on an upper portion of an active layer 401 as viewed from an insulation substrate 1.

In the TFT element having the cross-sectional constitution shown in FIG. 1B, an electric current usually flows between the source electrode 501 and the drain electrode 502 via the first contact layer 402, the active layer 401 and the second contact layer 403 only when the TFT element is in an ON state. That is, when the TFT element is in an OFF state, there is no possibility that a leak current flows between the source electrode 501 and the drain electrode 502 via the first contact layer 402, the active layer 401 and the second contact layer 403. Accordingly, it may be also considered that the first contact layer 402 and the second contact layer 403 function as resistances when the TFT element is in an OFF state, for example.

Accordingly, in forming the reversely-staggered-type TFT element of this embodiment, for example, as shown in FIG. 3, by forming the first contact layer 402 and the second contact layer 403 such that the first contact layer 402 is interposed between the source electrode 501 and the above-mentioned one etching end surface E1 of the active layer 401 and the second contact layer 403 is interposed between the drain electrode 502 and the above-mentioned another etching end surface E2 of the active layer 401, the leak current which flows in the TFT element when the TFT element is in an OFF state can be further reduced.

The TFT element having the cross-sectional constitution shown in FIG. 3 may be formed in accordance with following steps, for example.

First of all, the gate electrode 2 and the insulation layer 3 are formed on the surface of the insulation substrate 1. Next, for example, the amorphous silicon film is formed on the whole surface of the insulation layer 3, and the whole or a portion of the amorphous silicon film is formed into polycrystalline silicon in accordance with the above-mentioned manner. Then, the silicon film which has the whole or the portion thereof formed into polycrystalline silicon is etched to form the active layer 401 of each TFT element.

Next, on the whole surface of the insulation layer 3 on which the active layer 401 is formed, for example, an n-type amorphous silicon film used for forming the first contact layer 402 and the second contact layer 403, and a metal film used for forming the source electrode 501 and the drain electrode 502 are subsequently formed and, thereafter, the metal film is etched so as to form the source electrode 501 and the drain electrode 502. Here, to enhance the adhesiveness between the metal film and the n-type amorphous silicon film, it is desirable to use a metal film which is formed by stacking a first metal film which exhibits favorable adhesiveness with the amorphous silicon film and a second metal film which exhibits high electric conductivity, for example.

Finally, for example, using the source electrode 501 and the drain electrode 502 as masks, the n-type amorphous silicon film is etched so as to form the first contact layer 402 and the second contact layer 403.

By forming the TFT element in accordance with the above-mentioned steps, it is possible to further reduce a leak current which flows in the TFT element when the TFT element is in an OFF state without increasing the number of steps.

Figure 4:
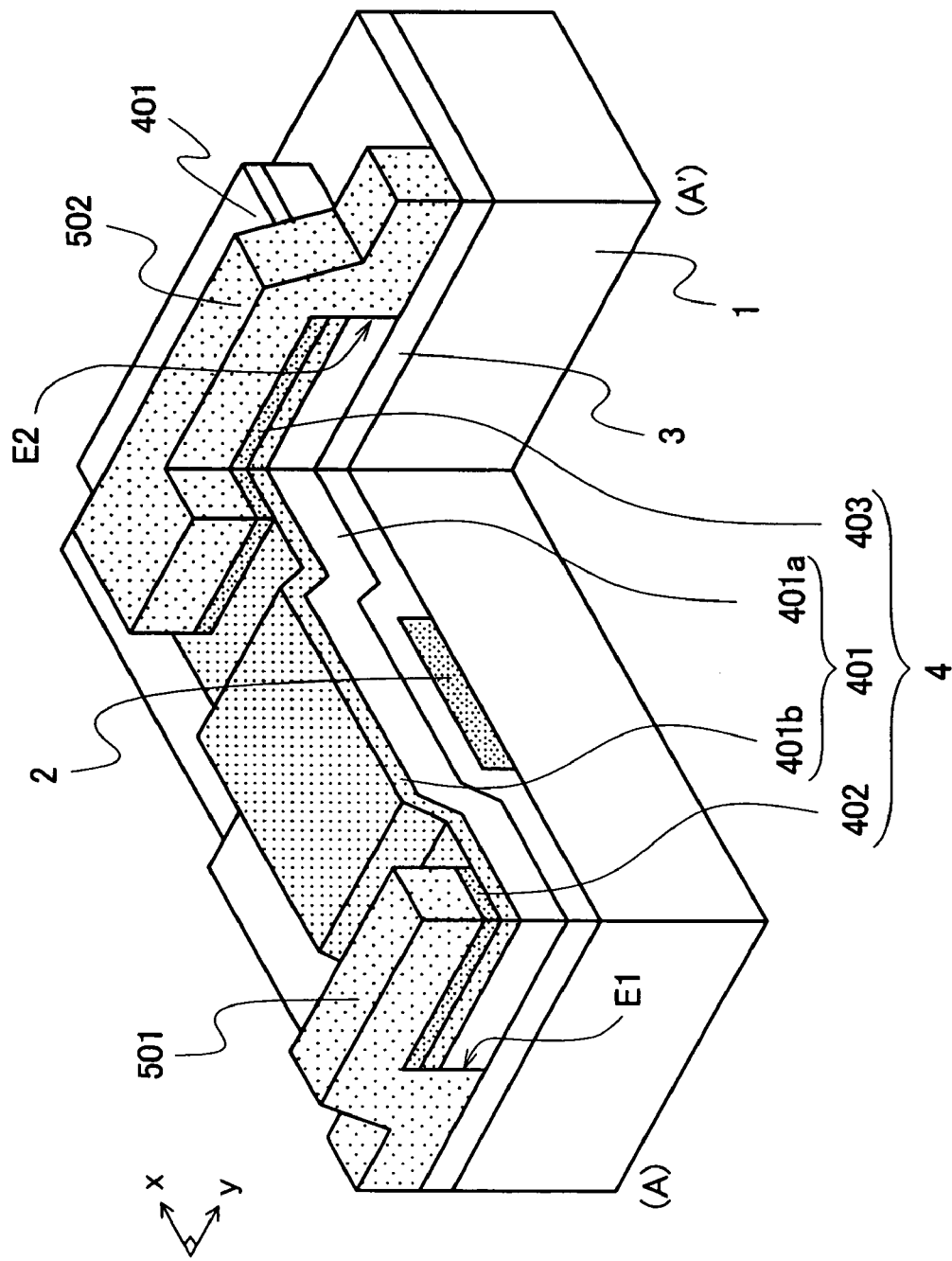
FIG. 4 is a schematic perspective view showing a second application example of the TFT element of the embodiment.

FIG. 4 is a schematic perspective view showing a second application example of the TFT element of this embodiment. Here, FIG. 4 shows the second application example having the cross-sectional constitution taken along a line A-A' in FIG. 1A.

In the reversely-staggered-type TFT element of this embodiment, in general, as shown in FIG. 1B and FIG. 3, the active layer 401 is formed of only a polycrystalline silicon layer.

However, when the active layer 401 is formed of only a polycrystalline silicon layer, there may be a case in which, for example, when the amorphous silicon film is formed into polycrystalline silicon, the polycrystalline silicon layer (active layer 401) on the gate electrode 2 becomes thin. As a result, for example, there may arise a drawback that an ON current becomes small.

Accordingly, in forming the TFT element having the constitution of this embodiment, for example, as shown in FIG. 4, the TFT element may adopt the two-layered active layer 401 which is constituted of a polycrystalline silicon layer 401a and an amorphous silicon layer 401b stacked on the polycrystalline silicon layer 401a.

FIG. 5A to FIG. 5D are schematic views showing one example of a semiconductor device having reversely-staggered-type TFT elements.

Figure 5A:
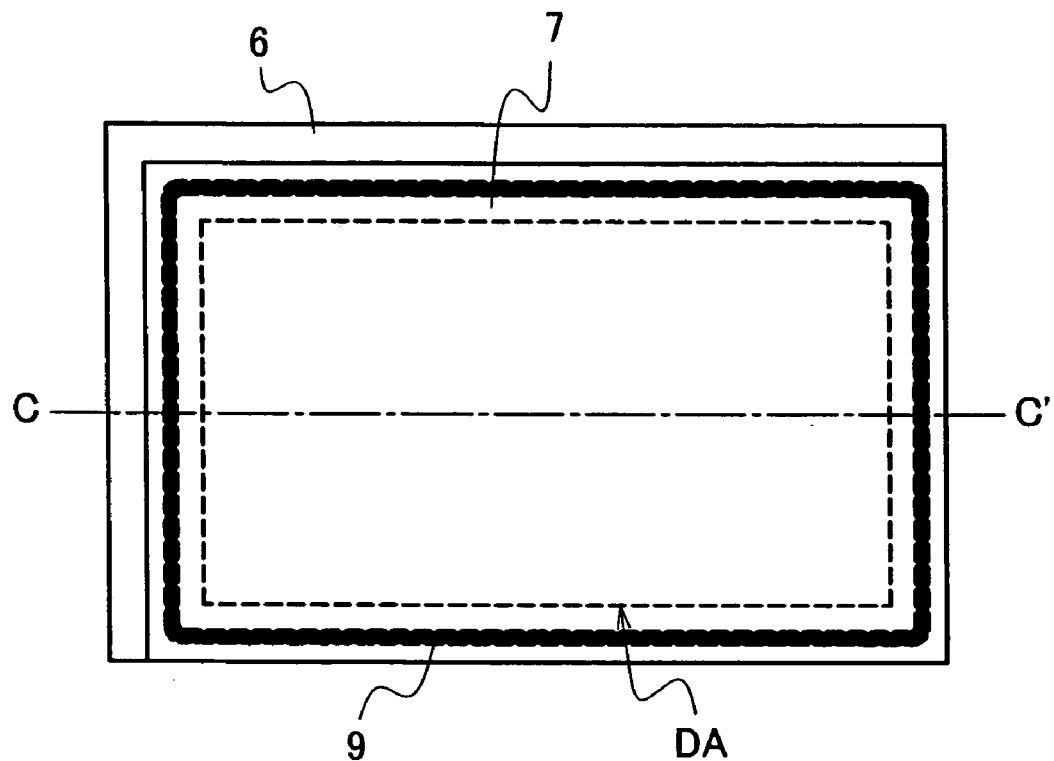
FIG. 5A is a schematic plan view showing one constitutional example of a liquid crystal display panel.
Figure 5B:
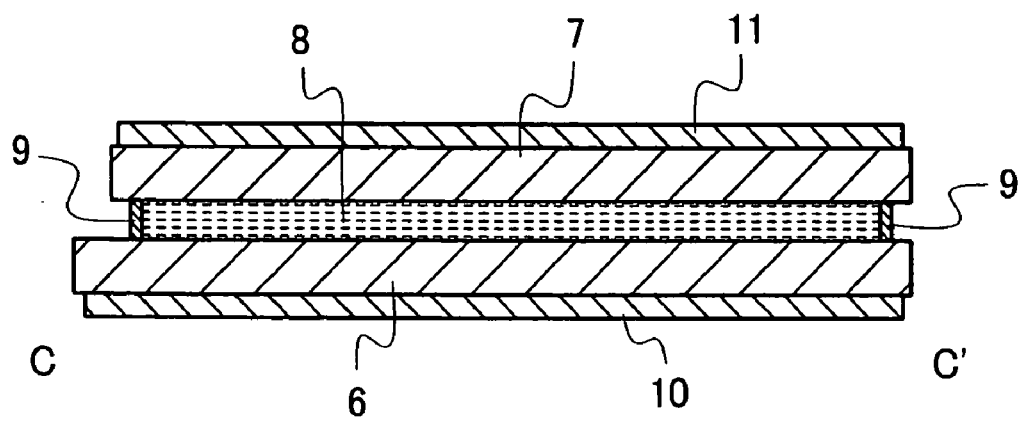
FIG. 5B is a schematic cross-sectional view showing one example of the cross-sectional constitution of the TFT element taken along a line C-C' in FIG. 5A.
Figure 5C:
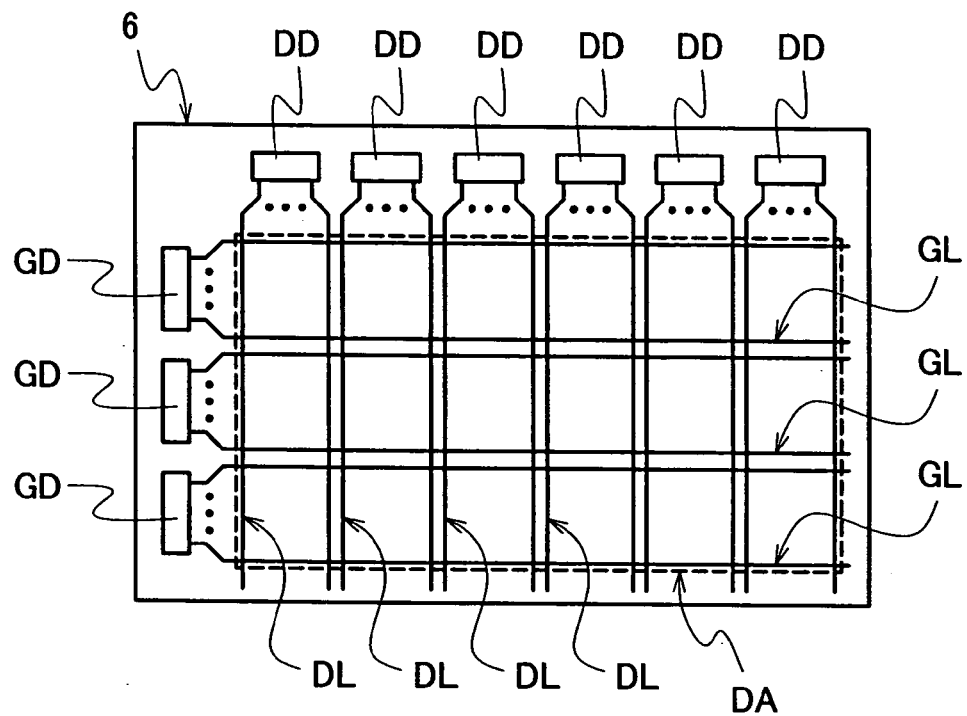
FIG. 5C is a schematic plan view showing one constitutional example of a TFT substrate in the liquid crystal display panel shown in FIG. 5A.
Figure 5D:
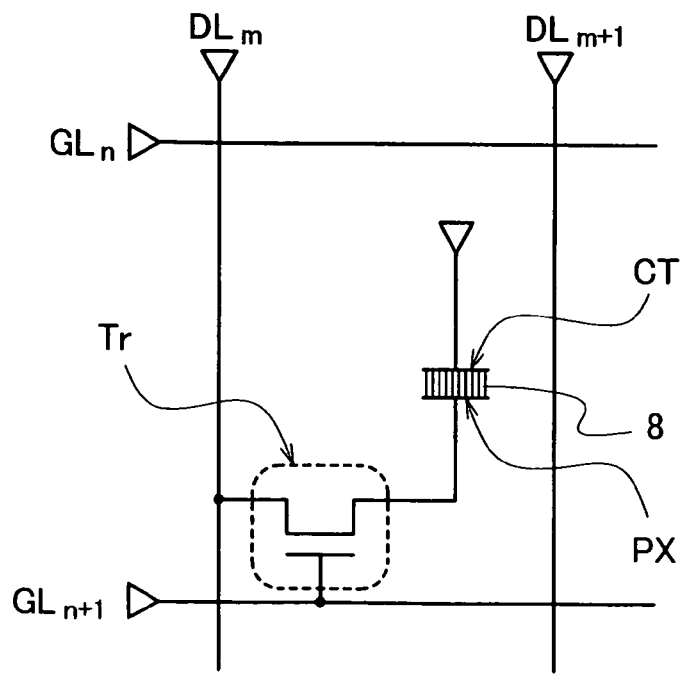
FIG. 5D is a schematic circuit diagram showing one constitutional example of one pixel of a liquid crystal display panel.
Figure 6A:
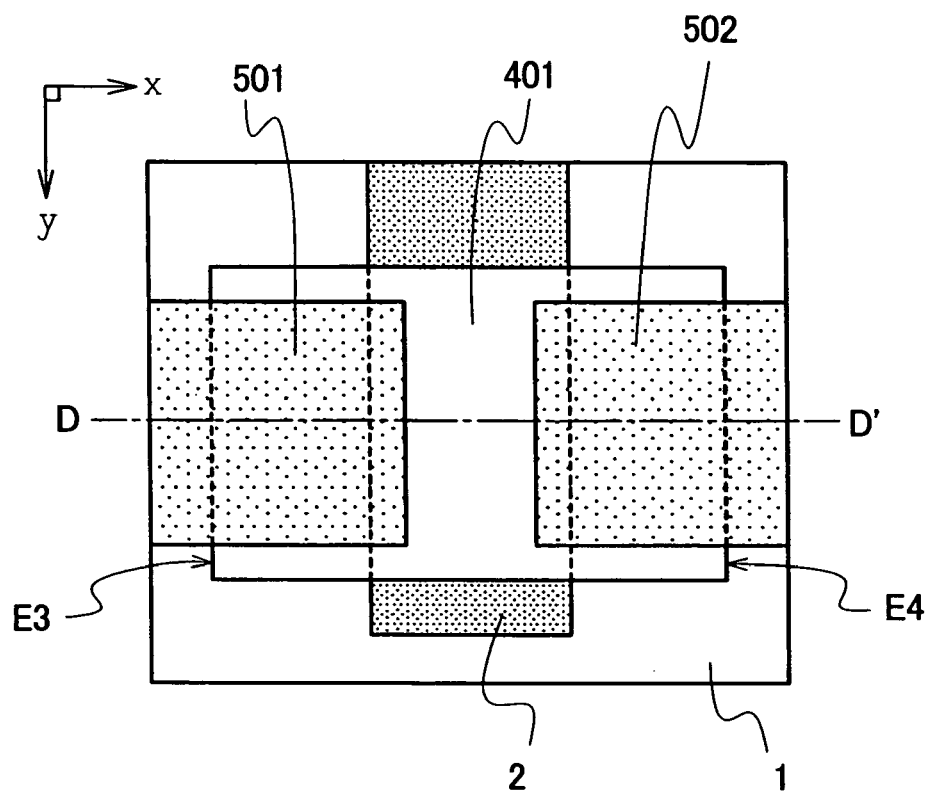
FIG. 6A is a schematic plan view showing one constitutional example of a conventional reversely-staggered-type TFT element.
Figure 6B:
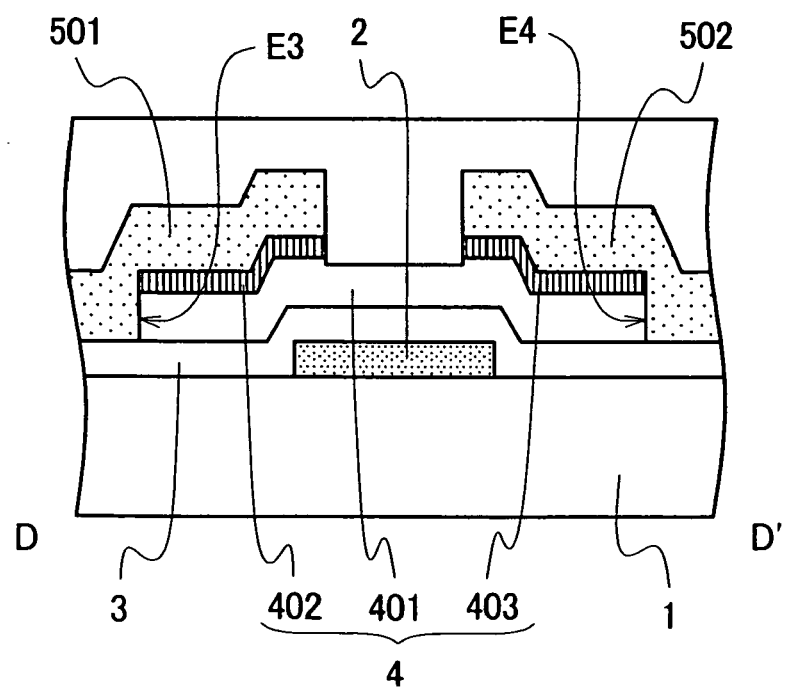
FIG. 6B is a schematic cross-sectional view showing one example of the cross-sectional constitution taken along a line D-D' in FIG. 6A.
Figure 6C:
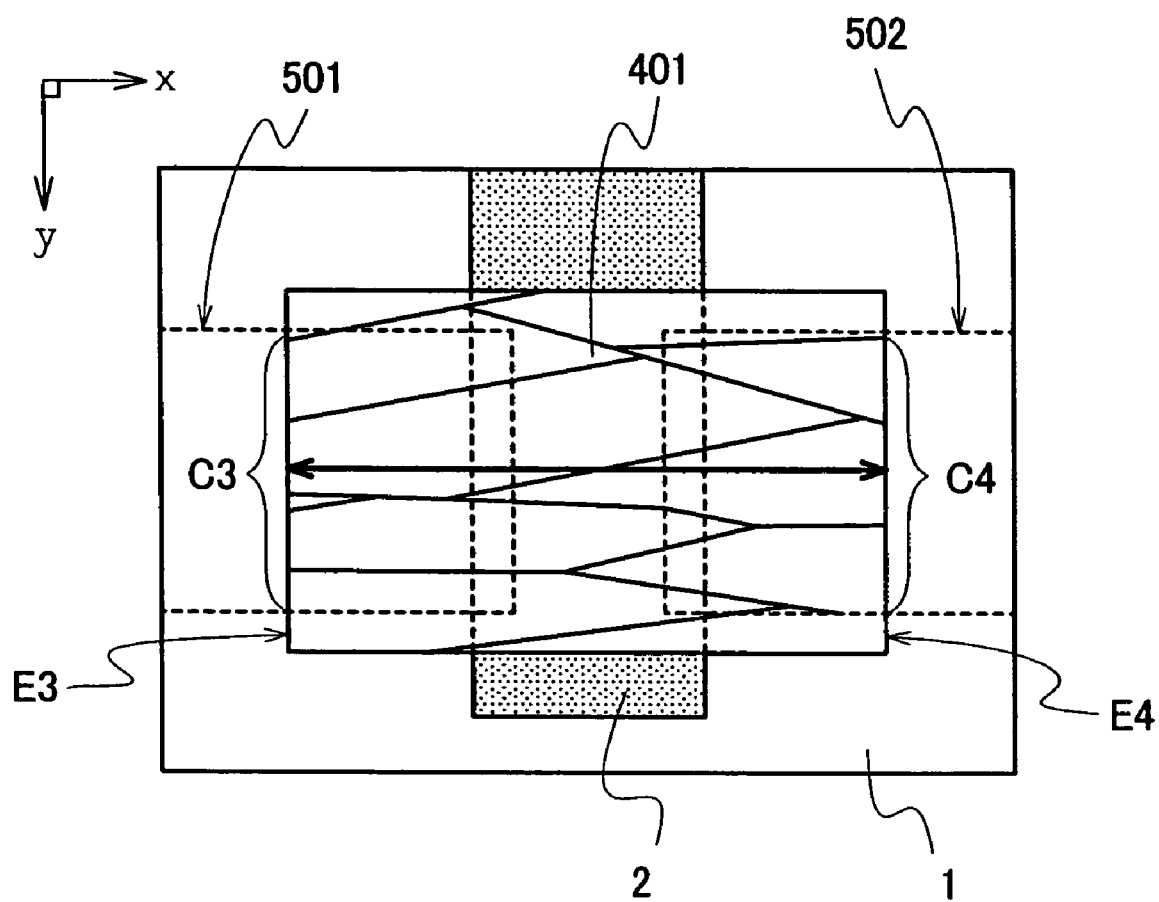
FIG. 6C is a schematic plan view showing the schematic constitution of an active layer in a TFT element shown in FIG. 6A and a path of a leak current.
Figure 7A:
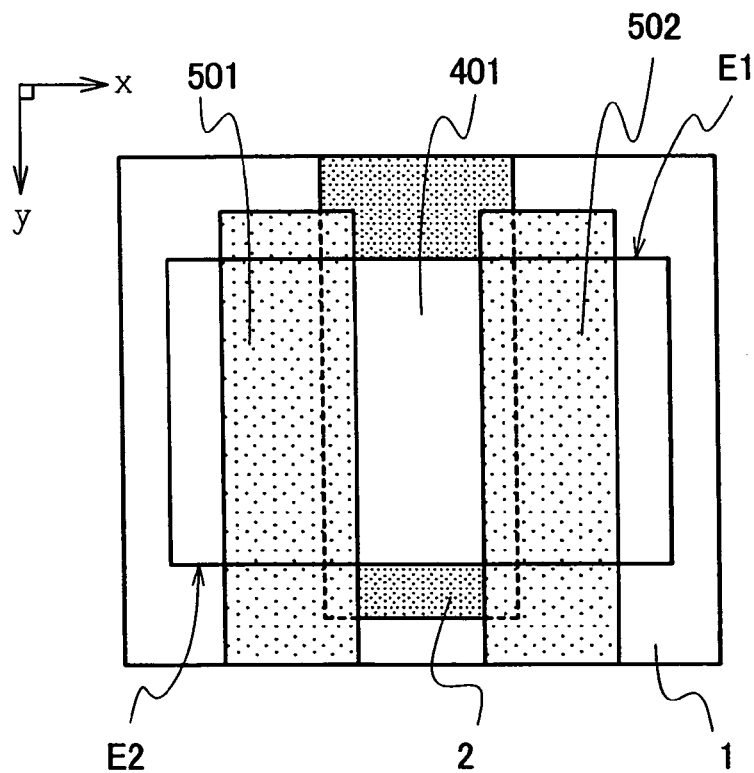
FIG. 7A is a schematic plan view showing another constitutional example of a conventional reversely-staggered-type TFT element.
Figure 7B:
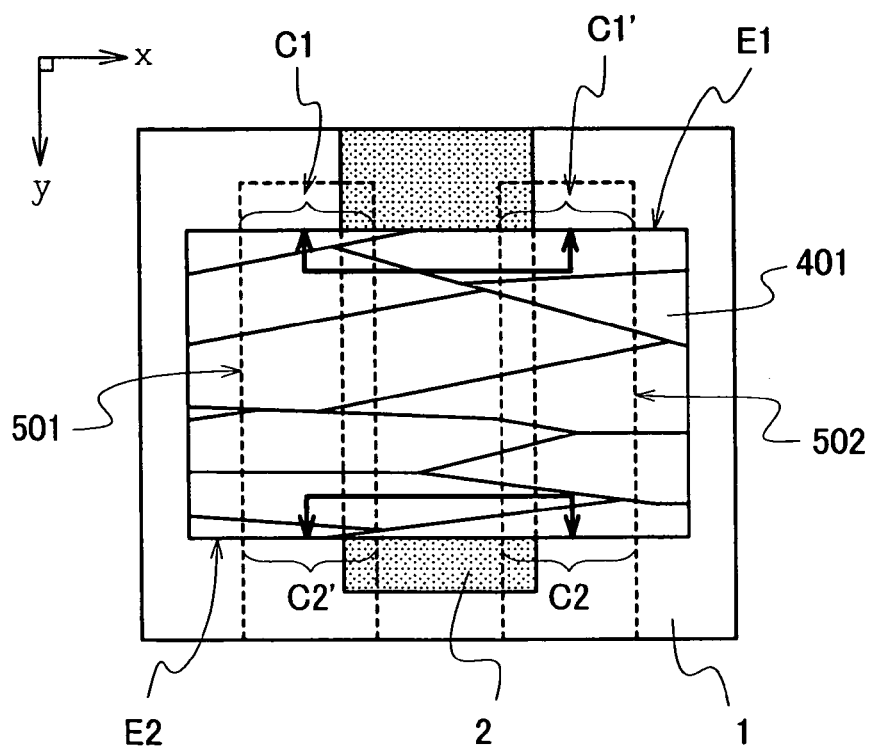
FIG. 7B is a schematic plan view showing the schematic constitution of an active layer in a TFT element shown in FIG. 7A and a path of a leak current.

FIG. 5A is a schematic plan view showing one constitutional example of a liquid crystal display panel. FIG. 5B is a schematic cross-sectional view showing one example of the cross-sectional constitution taken along a line C-C' in FIG. 5A. FIG. 5C is a schematic plan view showing one constitutional example of a TFT substrate of the liquid crystal display panel shown in FIG. 5A. FIG. 5D is a schematic circuit diagram showing one constitutional example of one pixel of the liquid crystal display panel.

The constitution of the TFT element of the present invention (this embodiment) is applicable to a semiconductor device which forms the reversely-staggered-type TFT element having an active layer formed using polycrystalline semiconductor on a substrate. As such a semiconductor device to which the TFT element of the present invention is applicable, an active-matrix-type TFT liquid crystal display panel can be named, for example.

The TFT liquid crystal display panel is, for example, as shown in FIG. 5A and FIG. 5B, a display panel which seals a liquid crystal material 8 between a pair of substrates consisting of a TFT substrate 6 and a counter substrate 7. Here, the TFT substrate 6 and the counter substrate 7 are adhered to each other using a sealing material 9 which is annually formed outside a display region DA, and the liquid crystal material 8 is hermetically sealed in the space surrounded by the TFT substrate 6, the counter substrate 7 and the sealing material 9.

Further, when the TFT liquid crystal display panel is of a transmissive type or of a transflective type, a lower polarizer 10 is arranged on a surface of the TFT substrate 6 which faces the outside, and an upper polarizer 11 is arranged on a surface of the counter substrate 7 which faces the outside. Further, a phase difference plate having one to several layers may be arranged between the TFT substrate 6 and the lower polarizer 10, and a phase difference plate may be arranged between the counter substrate 7 and the upper polarizer 11. Further, when the TFT liquid crystal display panel is of a reflective type, the lower polarizer 10 may be omitted in general.

On the TFT substrate 6, for example, as shown in FIG. 5C, a plurality of scanning signal lines GL and a plurality of video signal lines DL are formed. Here, the scanning signal lines GL and the video signal lines DL are formed by way of an insulation layer. Further, a display region DA is constituted of a mass of pixels arranged in a matrix array, wherein one pixel has the circuit constitution shown in FIG. 5D. That is, one pixel includes, for example, a TFT element (MISFET) Tr which functions as an active element (also referred to as a switching element) and a pixel electrode PX connected to a source electrode of the TFT element Tr. Here, the TFT element Tr of each pixel has, for example, a gate electrode thereof connected to the scanning signal line $GL_{n+1}$ and a drain electrode thereof connected to the video signal line $DL_m$, for example. Further, each pixel forms a set of electrodes using the pixel electrode PX and a counter electrode (also referred to as a common electrode) CT, for example, and possesses pixel capacitance (liquid crystal capacitance) using the liquid crystal material 8 as a dielectric. By controlling a potential difference between the pixel electrode PX and the counter electrode CT, the alignment of liquid crystal molecules in the liquid crystal material 8 is controlled and hence, the brightness (gray scales) of each pixel is controlled.

Further, recently, there has been also proposed a liquid crystal display panel in which, for example, as shown in FIG. 5C, outside the display region DA of the TFT substrate 6, a first drive circuit GD and a second drive circuit DD are formed. Here, the first drive circuit GD is an integrated circuit which performs an ON/OFF control of a scanning signal applied to the respective scanning signal lines GL or the like, while the second drive circuit DD is an integrated circuit which performs a control of timing of the generation of a video signal which is applied to the respective video signal lines or applying of the signal or the like.

The first drive circuit GD and the second drive circuit DD are respectively constituted of a circuit which is formed by integrating a TFT element, a resistance element, a capacitive element and the like.

Further, in the conventional liquid crystal display panel, the first drive circuit GD and the second drive circuit DD are often formed by using a chip-like IC which is manufactured in a step different from steps for manufacturing a TFT substrate, for example. However, with respect to the TFT substrate 6 shown in FIG. 5C, the first drive circuit GD and the second drive circuit DD are formed together with the scanning signal lines GL, the video signal lines DL, the active elements (TFT elements Tr) and the like, and these drive circuits GD, DD are incorporated in the TFT substrate 6.

Here, the active element (TFT element Tr) formed in the display region DA of the conventional liquid crystal display panel is often of a reversely-staggered-type in which an active layer is formed using amorphous silicon. When the active element is of a reversely-staggered-type, to efficiently manufacture the TFT substrate 6 which incorporates the first drive circuit GD and the second drive circuit DD therein, it is desirable that respective TFT elements of the first drive circuit GD and the second drive circuit DD are also of a reversely-staggered-type, and the TFT elements of the first drive circuit GD and the second drive circuit DD are formed simultaneously with the active elements.

However, the TFT elements of the first drive circuit GD and the second drive circuit DD are required to be operated at an extremely high speed compared to the active elements formed in the display region. Accordingly, it is desirable that the respective TFT elements of the first drive circuit GD and the second drive circuit DD form respective active layers thereof using polycrystalline silicon.

As described above, when the active element is of a reversely-staggered-type, to efficiently manufacture the TFT substrate in which the first drive circuit GD and the second drive circuit DD are incorporated, it is desirable that the respective TFT elements of the first drive circuit GD and the second drive circuit DD are of the reversely-staggered-type in which the active layer is formed using polycrystalline silicon. Accordingly, in manufacturing such a TFT substrate, it is desirable to provide the constitution shown in FIG. 1A, FIG. 1B, FIG. 3 and the like, for example, to the respective TFT elements of the first drive circuit GD and the second drive circuit DD. By adopting such constitution, it is possible to easily reduce a leak current when the respective TFT elements in the first drive circuit GD and the second drive circuit DD are in an OFF state.

Further, when the active layers of the TFT elements of the first drive circuit GD and the second drive circuit DD are formed using polycrystalline silicon and the active layers of the active elements (TFT elements Tr) formed in the display region DA are formed using amorphous silicon, for example, after forming an amorphous silicon film on the whole surface of the insulation layer 3, it is sufficient to form only amorphous silicon in regions where the first drive circuit GD and the second drive circuit DD are formed into polycrystalline silicon and hence, it is possible to suppress lowering of manufacturing efficiency and elevation of manufacturing cost.

Further, in the above-mentioned explanation, the liquid crystal display panel (TFT substrate 6) is named as an example of the semiconductor device to which the constitution of the present invention is applicable. However, the semiconductor device to which the constitution of the present invention is applicable is not limited to such a liquid crystal display panel, and provided that a semiconductor device forms a reversely-staggered-type TFT element on a substrate thereof, the constitution of the present invention is applicable to any semiconductor device irrelevant to the application thereof.

Although the present invention has been specifically explained in conjunction with the embodiment heretofore, it is needless to say that the present invention is not limited to the above-mentioned embodiment and various modifications are conceivable without departing from the gist of the present invention.

What is claimed is:

1. A semiconductor device having a TFT element in which a gate electrode, an insulation film, a semiconductor layer, a source electrode and a drain electrode are stacked on a surface of an insulation substrate in this order, and
the semiconductor layer, the source electrode and the drain electrode are arranged on a surface of the insulation film, and a portion of the source electrode and a portion of the drain electrode respectively get over the semiconductor layer, wherein
the semiconductor layer includes an active layer made of polycrystalline semiconductor, a first contact layer interposed between the active layer and the source electrode, and a second contact layer interposed between the active layer and the drain electrode,
the active layer is a mass of fine crystals or granular crystals mainly constituted of strip-shaped crystals elongated in the channel length direction of the TFT element,
the TFT element is configured in a plan view such that the source electrode and the drain electrode are respectively pulled out from positions above the active layer in the channel width direction of the TFT element and in the directions opposite to each other, and
the TFT element is configured in a plan view such that the source electrode intersects with only one side out of two sides of the active layer which extend in the channel length direction, and the drain electrode intersects with only another side out of two sides of the active layer which extend in the channel length direction.

2. A semiconductor device having a TFT element in which a gate electrode, an insulation film, a semiconductor layer, a source electrode and a drain electrode are stacked on a surface of an insulation substrate in this order, and
the semiconductor layer, the source electrode and the drain electrode are arranged on a surface of the insulation film, and a portion of the source electrode and a portion of the drain electrode respectively get over the semiconductor layer, wherein
the semiconductor layer includes an active layer, a first contact layer interposed between the active layer and the source electrode, and a second contact layer interposed between the active layer and the drain electrode,
the active layer includes a polycrystalline semiconductor layer which is formed of a mass of fine crystals or granular crystals mainly constituted of strip-shaped crystals elongated in the channel length direction of the TFT element and an amorphous semiconductor layer which is stacked on the polycrystalline semiconductor layer as viewed from the insulation substrate,
the TFT element is configured in a plan view such that the source electrode and the drain electrode are respectively pulled out from positions above the active layer in the channel width direction of the TFT element and in the directions opposite to each other, and
the TFT element is configured in a plan view such that the source electrode intersects with only one side out of two sides of the active layer which extend in the channel length direction, and the drain electrode intersects with only another side out of two sides of the active layer which extend in the channel length direction.

3. A semiconductor device according to claim 2, wherein the first contact layer and the second contact layer are respectively arranged only on an upper portion of the active layer as viewed from the insulation substrate, and
the source electrode and an etching end surface of the active layer are brought into direct contact with each other, and the drain electrode and an etching end surface of the active layer are brought into direct contact with each other.

4. A semiconductor device according to claim 2, wherein connecting portions of the source electrode and the active layer are connected with each other via the first contact layer over the whole region, and
connecting portions of the drain electrode and the active layer are connected with each other via the second contact layer over the whole region.

5. A semiconductor device according to claim 4, wherein the first contact layer is also interposed between a portion of the source electrode which is pulled out to the outside of the active layer and the insulation layer, and
the second contact layer is also interposed between a portion of the drain electrode which is pulled out to the outside of the active layer and the insulation layer.

6. A display device including an insulation substrate, a display region which is formed of a mass of a plurality of pixel regions and one or a plurality of integrated circuit regions arranged outside the display region, wherein
a TFT element is arranged in the integrated circuit region,
the TFT element is formed by stacking a gate electrode, an insulation film, a semiconductor layer, a source electrode and a drain electrode on a surface of an insulation substrate in this order,
the semiconductor layer, the source electrode and the drain electrode are arranged on a surface of the insulation film, and a portion of the source electrode and a portion of the drain electrode respectively get over the semiconductor layer,
the semiconductor layer includes an active layer made of polycrystalline semiconductor, a first contact layer interposed between the active layer and the source electrode, and a second contact layer interposed between the active layer and the drain electrode, the active layer is a mass of fine crystals or granular crystals mainly constituted of strip-shaped crystals elongated in the channel length direction of the TFT element, the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

7. A display device including an insulation substrate, a display region which is formed of a mass of a plurality of pixel regions and one or a plurality of integrated circuit regions arranged outside the display region, wherein a TFT element is arranged in the integrated circuit region, the TFT element is formed by stacking a gate electrode, an insulation film, a semiconductor layer, a source electrode and a drain electrode on a surface of an insulation substrate in this order, and the semiconductor layer, the source electrode and the drain electrode are arranged on a surface of the insulation film, and a portion of the source electrode and a portion of the drain electrode respectively get over the semiconductor layer, the semiconductor layer includes an active layer, a first contact layer interposed between the active layer and the source electrode, and a second contact layer interposed between the active layer and the drain electrode, the active layer includes a polycrystalline semiconductor layer which is formed of a mass of fine crystals or granular crystals mainly constituted of strip-shaped crystals elongated in the channel length direction of the TFT element and an amorphous semiconductor layer which is stacked on the polycrystalline semiconductor layer as viewed from the insulation substrate, and the TFT element is configured in a plan view such that the source electrode and the drain electrode are respectively pulled out from positions above the active layer in the channel width direction of the TFT element and in the directions opposite to each other, and the TFT element is configured in a plan view such that the source electrode intersects with only one side out of two sides of the active layer which extend in the channel length direction, and the drain electrode intersects with only another side out of two sides of the active layer which extend in the channel length direction.

8. A display device according to claim 7, wherein in each one of the plurality of pixel regions formed in the display region, a switching element and a pixel electrode are arranged.

9. A display device according to claim 8, wherein the switching element is a MISFET having an amorphous semiconductor layer.

10. A display device according to claim 8, wherein the switching element is a MISFET having a polycrystalline semiconductor layer.

11. A display device according to claim 7, wherein the plurality of TFT elements and the plurality of pixel electrodes are arranged in the display region in a matrix array.

12. A display device according to any one of claim 11, wherein the first contact layer and the second contact layer are respectively arranged only on an upper portion of the active layer as viewed from the insulation substrate, and the source electrode and an etching end surface of the active layer are brought into direct contact with each other, and the drain electrode and an etching end surface of the active layer are brought into direct contact with each other.

13. A display device according to any one of claim 11, wherein connecting portions of the source electrode and the active layer are connected with each other via the first contact layer over the whole region, and connecting portions of the drain electrode and the active layer are connected with each other via the second contact layer over the whole region.

14. A display device according to claim 13, wherein the first contact layer is also interposed between a portion of the source electrode which is pulled out to the outside of the active layer and the insulation layer, and the second contact layer is also interposed between a portion of the drain electrode which is pulled out to the outside of the active layer and the insulation layer.

* * * * *